United States Patent
Tomiha et al.

(10) Patent No.: US 10,444,308 B2
(45) Date of Patent: Oct. 15, 2019

(54) MAGNETIC RESONANCE IMAGING APPARATUS

(71) Applicant: Toshiba Medical Systems Corporation, Otawara-shi (JP)

(72) Inventors: Sadanori Tomiha, Nasushiobara (JP); Miyuki Ota, Otawara (JP); Keiji Tahira, Utsunomiya (JP); Satoshi Imai, Nasushiobara (JP); Mitsuo Takagi, Otawara (JP)

(73) Assignee: Canon Medical Systems Corporation, Otawara-shi (JP)

(*) Notice: Subject to any disclaimer, the term of this patent is extended or adjusted under 35 U.S.C. 154(b) by 71 days.

(21) Appl. No.: 15/609,792

(22) Filed: May 31, 2017

(65) Prior Publication Data

US 2017/0343626 A1  Nov. 30, 2017

(30) Foreign Application Priority Data

May 31, 2016 (JP) .................. 2016-109295
May 30, 2017 (JP) .................. 2017-107052

(51) Int. Cl.
*G01R 33/54* (2006.01)
*G01R 33/36* (2006.01)

(52) U.S. Cl.
CPC ......... *G01R 33/36* (2013.01); *G01R 33/3664* (2013.01); *G01R 33/546* (2013.01)

(58) Field of Classification Search
CPC ............. G01R 33/3664; G01R 33/543; G01R 33/546; G01R 33/36

USPC ........................................................ 324/322
See application file for complete search history.

(56) References Cited

U.S. PATENT DOCUMENTS

| | | | | |
|---|---|---|---|---|
| 7,259,559 | B2* | 8/2007 | Nabetani | G01R 33/3415 324/307 |
| 9,955,897 | B2* | 5/2018 | Senegas | G16H 40/63 |
| 2009/0322335 | A1 | 12/2009 | Adachi et al. | |
| 2010/0060284 | A1 | 3/2010 | Sugiura | |
| 2011/0101980 | A1* | 5/2011 | Ohiwa | G01R 33/4833 324/309 |
| 2012/0271840 | A1* | 10/2012 | Vosniak | G06F 19/321 707/758 |
| 2015/0199121 | A1* | 7/2015 | Gulaka | G06F 3/04845 715/771 |

(Continued)

FOREIGN PATENT DOCUMENTS

| | | |
|---|---|---|
| JP | 5-68671 | 3/1993 |
| JP | 2004-49669 | 2/2004 |

(Continued)

*Primary Examiner* — Patrick Assouad
*Assistant Examiner* — Demetrius R Pretlow
(74) *Attorney, Agent, or Firm* — Oblon, McClelland, Maier & Neustadt, L.L.P.

(57) ABSTRACT

A magnetic resonance imaging apparatus according to an embodiment includes processing circuitry and a display. The processing circuitry acquires information of an RF (radio frequency) coil. The processing circuitry sets a protocol to be applied to imaging using the RF coil before execution of the imaging. When there are a plurality of protocols that can be selected as the protocol applied to the imaging, the display displays at least one protocol narrowed down from the protocols as the protocol that can be applied to the imaging, based on information of the RF coil.

6 Claims, 13 Drawing Sheets

11a

| COIL ID | COIL GROUP | REGION 1 | REGION 2 | REGION 3 |
|---|---|---|---|---|
| AA | A | KNEE | HAND, LEG | OTHERS |
| BA | B | HAND, LEG, KNEE, ABDOMEN, PELVIS | OTHERS | |
| BB | B | KNEE, ABDOMEN, PELVIS | OTHERS | |
| CC | C | CERVICAL SPINE, THORACIC SPINE, AND LUMBAR SPINE | OTHERS | |
| ... | ... | ... | ... | ... |

(56) References Cited

U.S. PATENT DOCUMENTS

2015/0369897 A1* 12/2015 Keil .................. G01R 33/546
 324/309
2016/0077175 A1 3/2016 Mori

FOREIGN PATENT DOCUMENTS

| JP | 2010-29644 | 2/2010 |
| JP | 2010-88870 | 4/2010 |
| JP | 2014-230610 | 12/2014 |
| JP | 2015-43920 | 3/2015 |

* cited by examiner

FIG.2

| COIL ID | COIL GROUP | REGION 1 | REGION 2 | REGION 3 |
|---|---|---|---|---|
| AA | A | KNEE | HAND, LEG | OTHERS |
| BA | B | HAND, LEG, KNEE, ABDOMEN, PELVIS | OTHERS | |
| BB | B | KNEE, ABDOMEN, PELVIS | OTHERS | |
| CC | C | CERVICAL SPINE, THORACIC SPINE, AND LUMBAR SPINE | OTHERS | |
| ... | ... | ... | ... | ... |

FIG.7

| COIL ID | COIL GROUP | REGION 1 | REGION 2 | REGION 3 | BODY POSTURE |
|---|---|---|---|---|---|
| DA | A | CHEST | LEG | OTHERS | PRONE POSTURE |
| DB | A | HEAD | LEG | OTHERS | SUPINE POSTURE |
| ... | ... | ... | ... | ... | ... |
| ... | ... | ... | ... | ... | ... |
| ... | ... | ... | ... | ... | ... |

FIG.8C

| COIL ID | COIL GROUP | REGION 1 | REGION 2 | REGION 3 | BODY POSTURE |
|---------|------------|----------|----------|----------|--------------|
| DB | A | HEAD | LEG | OTHERS | P: HEAD FIRST<br>Q: FOOT FIRST |
| ... | ... | ... | ... | ... | ... |
| ... | ... | ... | ... | ... | ... |
| ... | ... | ... | ... | ... | ... |
| ... | ... | ... | ... | ... | ... |

11a

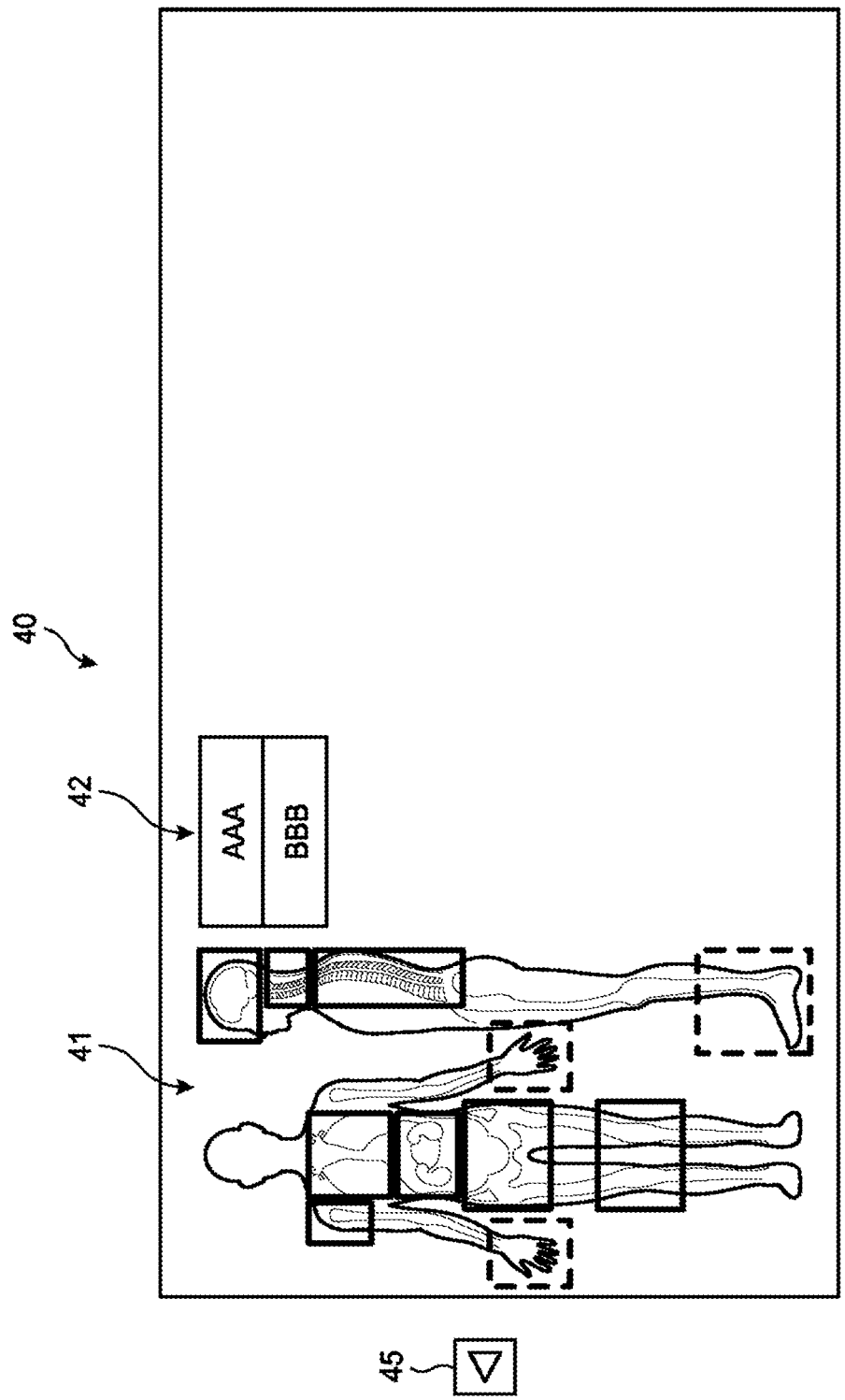

MAGNETIC RESONANCE IMAGING APPARATUS

CROSS-REFERENCE TO RELATED APPLICATIONS

This application is based upon and claims the benefit of priority from Japanese Patent Application No. 2016-109295, filed on May 31, 2016; and Japanese Patent Application No. 2017-107052, filed on May 30, 2017; the entire contents of which are incorporated herein by reference.

FIELD

Embodiments described herein relate generally to a magnetic resonance imaging apparatus.

BACKGROUND

There is a magnetic resonance imaging (MRI) apparatus that magnetically excites atomic nucleus spin of a subject placed in a static magnetic field by RE (Radio Frequency) pulses of a Larmor frequency to reconstruct an image from an MR (Magnetic Resonance) signal generated with the excitation.

BRIEF DESCRIPTION OF THE DRAWINGS

FIG. 2 is a diagram illustrating an example of a data structure of coil classification information;

FIG. 7 is a diagram illustrating an example of a data structure of coil classification information according to the first modification of the first embodiment;

FIG. 8C is a diagram illustrating an example of a data structure of coil classification information according to the second modification of the first embodiment;

FIG. 12 is an explanatory diagram of an example of processing performed by an MRI apparatus according to a sixth modification.

DETAILED DESCRIPTION

A magnetic resonance imaging apparatus according to an embodiment includes processing circuitry and a display. The processing circuitry acquires information of an RE (radio frequency) coil. The processing circuitry sets a protocol to be applied to imaging using the RF coil, before performing the imaging. The display displays at least one protocol that is narrowed down from protocols, when there are a plurality of protocols that can be selected as a protocol applied to the imaging, as a protocol applicable to the imaging based on the information of the RF coil.

A magnetic resonance imaging apparatus according to respective embodiments (hereinafter, also referred to as "MRI apparatus") will be described below with reference to the accompanying drawings. Note that embodiments are not limited to those described below. In addition, respective embodiments and respective modifications can be appropriately combined with one another.

First Embodiment

Figure 1:
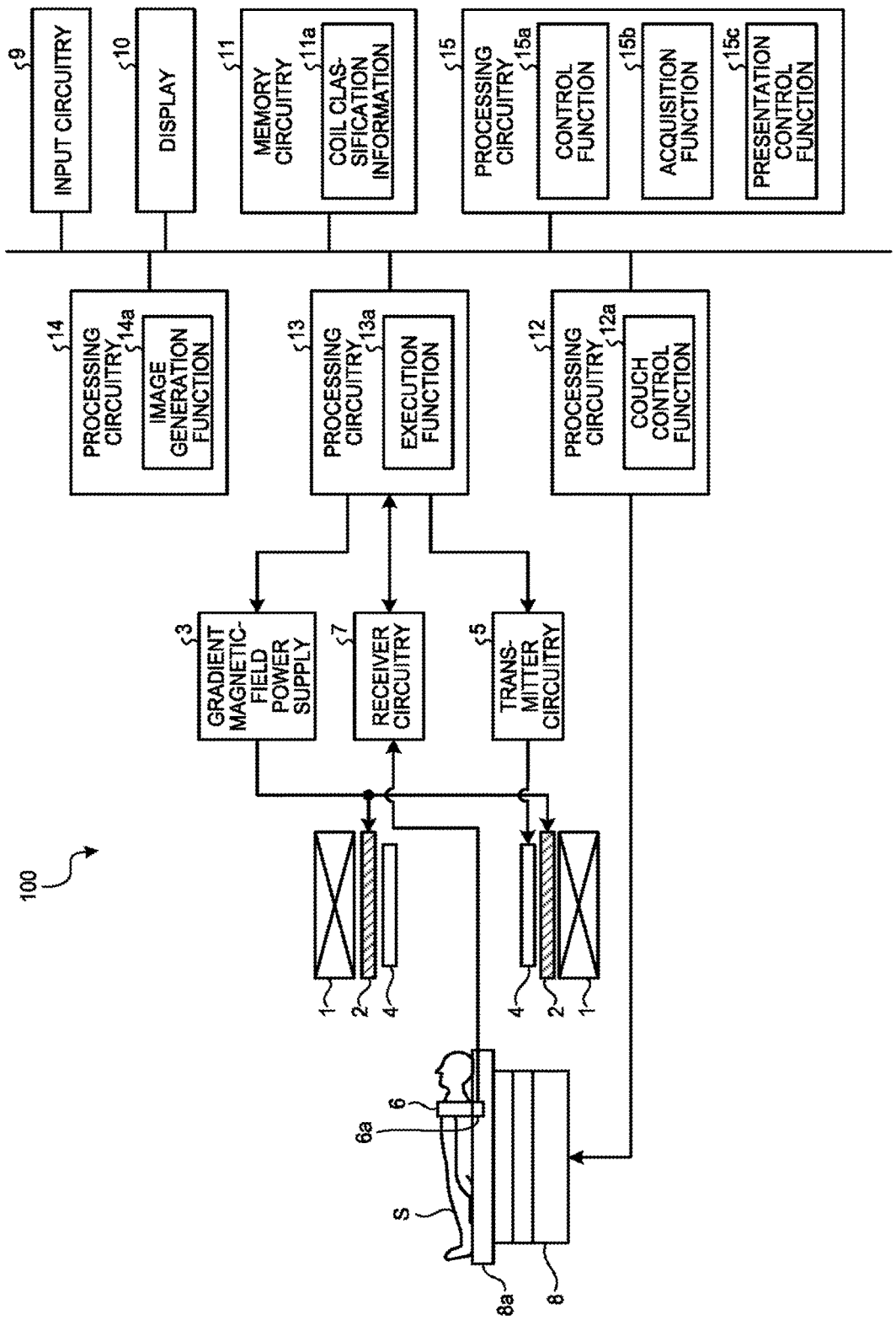
FIG. 1 is a functional block diagram illustrating a configuration of an MRI apparatus according to a first embodiment.

FIG. 1 is a functional block diagram illustrating a configuration of an MRI apparatus 100 according to a first embodiment. As illustrated in FIG. 1, the MRI apparatus 100 includes a static magnetic-field magnet 1, a gradient magnetic-field coil 2, a gradient magnetic-field power supply 3, a transmitter coil (RF (Radio Frequency) transmitter coil) 4, transmitter circuitry 5, a receiver coil (RF receiver coil) 6, receiver circuitry 7, a couch 8, input circuitry 9, a display 10, memory circuitry 11, and processing circuitries 12 to 15. A subject S (for example, a human body) illustrated in FIG. 1 is not included in the MRI apparatus 100. The configuration illustrated in FIG. 1 is only an example.

The static magnetic-field magnet 1 is formed in a substantially hollow cylindrical shape (including a shape in which a cross-section orthogonal to a central axis of a cylinder has an elliptical shape) to generate a uniform static magnetic field in an imaging space formed in an inner peripheral side. For example, the static magnetic-field magnet 1 is realized by a permanent magnet or a superconducting magnet.

The gradient magnetic-field coil 2 is formed in a substantially hollow cylindrical shape (including a shape in which a cross-section orthogonal to a central axis of a cylinder has an elliptical shape), and is arranged in an inner peripheral side of the static magnetic-field magnet 1. The gradient magnetic-field coil 2 includes three coils that generate a gradient magnetic field respectively along an x-axis, a y-axis, and a z-axis orthogonal to each other. The x-axis, the y-axis, and the z-axis constitute a device coordinate system unique to the MRI apparatus 106. For example, the direction of the x-axis is set in a vertical direction, and the direction of the y-axis is set to a horizontal direction. The direction of the z-axis is set to the same direction as a direction of a magnetic flux of a static magnetic field generated by the static magnetic-field magnet 1.

The gradient magnetic-field power supply 3 supplies an electric current respectively individually to the three coils provided in the gradient magnetic-field coil 2 to generate a gradient magnetic field corresponding to the x-axis, the y-axis, and the z-axis in the imaging space. The respective axes correspond to, for example, a readout direction, a phase encoding direction, and a slice direction. The axes corresponding to the readout direction, the phase encoding direction, and the slice direction constitute a logical coordinate system in order to define a slice area or a volume area to be imaged. The gradient magnetic field along the readout direction is referred to as "readout gradient magnetic field", the gradient magnetic field along the phase encoding direction is referred to as "phase-encoding gradient magnetic field", and the gradient magnetic field along the slice direction is referred to as "slice gradient magnetic field".

The respective gradient magnetic fields are superimposed to the static magnetic field generated by the static magnetic-field magnet 1, and used to add spatial position information to a magnetic resonance (MR) signal. Specifically, in the readout gradient magnetic field, the position information along the readout direction is added to the MR signal by changing the frequency of the MR signal according to the position in the readout direction. In the phase-encoding gradient magnetic field, the position information along the phase encoding direction is added to the MR signal by changing the phase of the MR signal along the phase encoding direction. When the imaging area is the slice area, the slice gradient magnetic field is used to decide the direction, the thickness, and the number of the slice areas. When the imaging area is the volume area, the position information along the slice direction is added to the MR signal by changing the phase of the MR signal according to the position in the slice direction.

The transmitter coil 4 is formed in a substantially hollow cylindrical shape (including a shape in which a cross-section orthogonal to the central axis of the cylinder has an elliptical shape), and is arranged inside of the gradient magnetic-field coil 2. The transmitter coil 4 applies an RF pulse output from the transmitter circuitry 5 to the imaging space.

The transmitter circuitry 5 outputs the RF pulse corresponding to the Larmor frequency to the transmitter coil 4. For example, the transmitter circuitry 5 includes oscillation circuitry, phase selection circuitry, frequency conversion circuitry, amplitude modulation circuitry, and RF amplification circuitry. The oscillation circuitry generates the RF pulse having a resonance frequency unique to the target atomic nucleus placed in the static magnetic field. The phase selection circuitry selects a phase of the RF pulse output from the oscillation circuitry. The frequency conversion circuitry converts the frequency of the RF pulse output from the phase selection circuitry. The amplitude modulation circuitry modulates amplitude of the RE pulse output from the frequency conversion circuitry according to, for example, a sine function. The RF amplification circuitry amplifies the RF pulse output from the amplitude modulation circuitry, and outputs the amplified RE pulse to the transmitter coil 4.

The receiver coil 6 is installed near the subject S, and receives the MR signal emitted from the subject S due to an influence of the RE pulse. The receiver coil 6 is connectable to a connector (connector port, port) 6a embedded in a top board 8a described later. The connector 6a is connected to the receiver circuitry 7. That is, the connection form between the receiver coil 6 and the receiver circuitry 7 is connection by wire (wired connection) via the connector 6a. Upon reception of the MR signal, the receiver coil 6 connected to the connector 6a outputs the received MR signal to the receiver circuitry 7 via the connector 6a. The connector 6a reads an ID (Identification) for uniquely identifying the connected receiver coil 6 from a connection part of the receiver coil 6, and outputs the read ID to the receiver circuitry 7. The receiver coil 6 is an example of the RE coil.

The receiver circuitry 7 generates signal data based on the MR signal output from the receiver coil 6, and outputs the generated MR signal data to processing circuitry 13. For example, the receiver circuitry 7 includes selection circuitry, preamplifier circuitry, phase detector circuitry, and analog-digital converter circuitry. The selection circuitry selectively inputs the MR signal output from the receiver coil 6. The preamplifier circuitry amplifies the MR signal output from the selection circuitry. The phase detector circuitry detects the phase of the MR signal output from the preamplifier circuitry. The analog-digital converter circuitry converts an analog signal output from the phase detector circuitry to a digital signal to generate MR signal data, and outputs the generated MR signal data to the processing circuitry 13. Upon reception of the ID from the receiver coil 6, the receiver circuitry 7 outputs the received ID to the processing circuitry 13.

An example in which the transmitter coil 4 applies the RF pulse and the receiver coil 6 receives the MR signal is described here; however, the forms of the transmitter coil and the receiver coil are not limited thereto. For example, the transmitter coil 4 can have a reception function of receiving the MR signal. That is, the transmitter coil 4 can be a dual-purpose coil for transmission and reception. Further, the receiver coil 6 can have a transmission function of applying the RF pulse. That is, the receiver coil 6 can be the dual-purpose coil for transmission and reception. When the transmitter coil 4 has the reception function, the receiver circuitry 7 generates the MR signal data also based on the MR signal received by the transmitter coil 4. When the receiver coil 6 has the transmission function, the transmitter circuitry 5 outputs the RF pulse also to the receiver coil 6.

While a case where the connection form between the receiver coil 6 and the receiver circuitry 7 is the wired connection has been described above, the connection form can be wireless connection. An example in which the connection form between the receiver coil 6 and the receiver circuitry 7 is wireless connection is described here.

For example, the receiver coil 6 includes a wireless transmitter and the receiver circuitry 7 includes a wireless receiver. The wireless transmitter of the receiver coil 6 has the same circuitry as the selection circuitry, the preamplifier circuitry, the phase detector circuitry, and the analog-digital converter circuitry of the receiver circuitry 7 described above, and generates the MR signal data by digitalizing the MR signal in the same method as that of the receiver circuitry 7 described above. The wireless transmitter transmits the generated MR signal data to the receiver circuitry 7 via the wireless communication. The wireless transmitter also transmits an ID to the receiver circuitry 7 via the wireless communication. As the standards of the wireless transmitter of the receiver coil 6 and the wireless receiver of the receiver circuitry 7, for example, the Bluetooth® can be mentioned; however, the standards thereof are not limited thereto. Other standards of wireless communication can be adopted as the standards of the wireless transmitter of the receiver coil 6 and the wireless receiver of the receiver circuitry 7.

When the wireless receiver of the receiver circuitry 7 receives the MR signal data and the ID from the wireless transmitter of the receiver coil 6, the receiver circuitry 7 outputs the received MR signal data and ID to the processing circuitry 13.

Among the plurality of elements constituting the MRI apparatus 100, a part configured by a plurality of elements other than the receiver coil 6 is referred to as "apparatus body". In both cases where the connection form between the receiver coil 6 and the receiver circuitry 7 is the wired connection and where the connection form between the receiver coil 6 and the receiver circuitry 7 is the wireless connection, the receiver coil 6 can be connected to the apparatus body.

The couch 8 includes the top board 8*a* on which the subject S is placed, and when imaging of the subject S is to be performed, the top board 8*a* is inserted into the imaging space formed inside of the static magnetic-field magnet 1 and the gradient magnetic-field coil 2. For example, the couch 8 is installed so that the longitudinal direction thereof is parallel to the central axis of the static magnetic-field magnet 1.

The input circuitry 9 receives an input operation of various instructions and various pieces of information from an operator. For example, the input circuitry 9 is realized by a trackball, a switch button, a mouse, a keyboard, or touch panel. The input circuitry 9 is connected to the processing circuitry 15, converts the input operation received from the operator to an electric signal, and outputs the electric signal to the processing circuitry 15.

The display 10 displays various pieces of information and various images. For example, the display 10 is realized by a liquid crystal monitor, a CRT (Cathode Ray Tube) monitor, or a touch panel. The display 10 is connected to the processing circuitry 15, and converts the data of various pieces of information and various images transmitted from the processing circuitry 15 to electric signals for display and output the electric signals. The display 10 according to the first embodiment displays protocol candidates and candidates for imaging conditions to present the protocol candidates and the candidates for imaging conditions to a user. The display 10 is arranged for example in an operator's room.

The memory circuitry 11 memorizes various kinds of data. For example, the memory circuitry 11 memorizes MR signal data and image data for each subject S. For example, the memory circuitry 11 is realized by a semiconductor memory element such as a RAM (Random Access Memory) or a flash memory, a hard disk, or an optical disk. The memory circuitry 11 according to the first embodiment also memorizes coil classification information 11*a*.

The processing circuitry 12 has a couch control function 12*a*. The processing circuitry 12 is connected to the couch 8. For example, the processing circuitry 12 is realized by a processor. The couch control function 12*a* controls the operation of the couch 8 by outputting a control electric signal to the couch 8. For example, the couch control function 2*a* receives an instruction to move the top board 8*a* in a longitudinal direction, a vertical direction, or a horizontal direction via the input circuitry 9 from the operator, and operates a drive mechanism of the top board 8*a* provided in the couch 8 so as to move the top board 8*a* according to the received instruction.

The processing circuitry 13 has an execution function 13*a*. For example, the processing circuitry 13 is realized by a processor. The execution function 13*a* executes various protocols. Specifically, the execution function 13*a* executes the various protocols by driving the gradient magnetic-field power supply 3, the transmitter circuitry 5, and the receiver circuitry 7 based on sequence execution data output from the processing circuitry 15.

The sequence execution data here is information defining a protocol indicating a procedure for collecting the MR signal data. Specifically, the sequence execution data is information defining the timing at which the gradient magnetic-field power supply 3 supplies the electric current to the gradient magnetic-field coil 2 and intensity of the supplied electric current, intensity of the RF pulse current supplied by the transmitter circuitry 5 to the transmitter coil 4 and the supply timing thereof, a detection timing at which the receiver circuitry 7 detects the MR signal, and the like.

The execution function 13*a* receives the MR signal data from the receiver circuitry 7 as a result of performing various pulse sequences, and stores the received MR signal data in the memory circuitry 11. Aggregate of the MR signal data received by the execution function 13*a* is arranged two-dimensionally or three-dimensionally depending on position information added by the readout gradient magnetic field, the phase-encoding gradient magnetic field, and the slice gradient magnetic field described above, and stored in the memory circuitry 11 as data constituting a k space.

Upon reception of the ID output from receiver circuitry 7, the processing circuitry 13 stores the received ID in the memory circuitry 11. At this time, the processing circuitry 13 stores the ID for each examination in the memory circuitry 11. The examination is a unit for executing a protocol group. The protocol included in the protocol group is a unit for executing the imaging.

The processing circuitry 14 includes an image generation function 14*a*. For example, the processing circuitry 14 is realized by a processor. The image generation function 14*a* generates an image based on the MR signal data stored in the memory circuitry 11. Specifically, the image generation function 14*a* reads the MR signal data stored in the memory circuitry 11 by the execution function 13*a*, and applies post-processing, that is, re-configuration processing such as Fourier transform to the read MR signal data to generate an image. The image generation function 14*a* stores the image data of the generated image in the memory circuitry 11.

The processing circuitry 15 has a control function 15*a*, an acquisition function 15*b*, and a presentation control function 15*c*. For example, the processing circuitry 15 is realized by a processor.

The control function 15*a* executes overall control of the MRI apparatus 100 by controlling the respective constituent elements provided in the MRI apparatus 100. For example, the control function 15*a* receives an input of various parameters related to a pulse sequence from the operator via the input circuitry 9, and generates a sequence execution data based on the received parameters. The control function 15*a* transmits the generated sequence execution data to the processing circuitry 13, thereby executing the various pulse sequences. For example, the control function 15*a* reads the image data of an image requested by the operator from the memory circuitry 11 and outputs the read image data to the display 10.

The acquisition function 15*b* acquires the coil classification information 11*a*. The presentation control function 15*c* controls the display 10 so that candidates for the imaging conditions are presented based on the coil classification information lie. The acquisition function 15*b* and the presentation control function 15*c* are described later.

The word "processor" used in the above descriptions indicates, for example, a CPU (Central processing unit), a GPU (Graphics processing unit), or circuitries such as an application specific integrated circuit (ASIC), a programmable logic device (for example, a simple programmable logic device (SPLD), a complex programmable logic device (CPLD), and a field programmable gate array (FPGA). Instead of saving a program in the memory circuitry 11, it can be configured to directly incorporate a program in circuitry of the processor. In this case, the processor realizes the function by reading and executing the program incorporated in the circuitry.

The overall configuration of the MRI apparatus 100 according to the first embodiment has been described above.

An MRI apparatus displays a screen for selecting the protocol and the imaging condition such as a TE (Echo Time) and a TR (Repetition Time) at the time of executing the protocol by a user, and a screen for selecting the direction (orientation) and a body posture of a subject on the display, before performing imaging in the examination of the subject, so that the user selects the protocol and the imaging condition, and the direction and the body posture of the subject. The MRI apparatus sets the selected protocol and imaging condition as the protocol executed at the time of imaging and the imaging condition of the protocol, and sets the direction and the body posture of the selected subject as the direction and the body posture of the subject at the time of imaging. That is, the MRI apparatus causes the user to set the protocol and the imaging condition, and the direction and the body posture of the subject before performing imaging.

The MRI apparatus specifies the receiver coil connected to the connector at the time of displaying the screen for causing the user to select the protocol and the imaging condition. It can be considered that the MRI apparatus displays the protocol and the imaging condition of the protocol for performing imaging using the specified receiver coil as the candidate for the protocol to be used for imaging and the candidate for the imaging condition on the display. However, when a plurality of types of receiver coils are connected to the connector, the MRI apparatus displays many candidates for the protocols and many candidates for the imaging conditions on the display, because the protocol for performing imaging is different for each type of the receiver coil. Further, for example, even when the receiver coil connected to the connector is only one type, but there are many types of imaging regions that can be imaged by using the receiver coil, many candidates for the protocols and many candidates for the imaging conditions are displayed on the display. When many candidates for the protocols and many candidates for the imaging conditions are displayed on the display, the user selects the protocol to be used for imaging from the many candidates for the protocols and selects the imaging condition from the many candidates for the imaging conditions, and thus the user cannot easily select the protocol and the imaging condition to be used for imaging. Therefore, in this case, the user cannot easily perform setting of the protocol and the imaging condition.

Therefore, as described below, the MRI apparatus 100 according to the first embodiment is configured so that the user can easily perform setting of the protocol and the imaging condition.

FIG. 2 is a diagram illustrating an example of a data structure of the coil classification information 11*a*. The coil classification information 11*a* is information in which the type of the receiver coil 6 is classified based on the region that can be imaged by the receiver coil 6. That is, the coil classification information 11*a* is information in which the receiver coil 6 is classified according to the imaging application. In this manner, the coil classification information 11*a* is information of the receiver coil 6. The region that can be imaged indicates a region of the body of the subject S that can be an imaging target. As illustrated in the example in FIG. 2, a plurality of records including each item of "coil ID (Identification)", "coil group", "region 1", "region 2", and "region 3" are registered in the coil classification information 11*a*.

In the item of "coil ID", an ID for uniquely identifying the receiver coil 6 is registered. The ID "AA" registered in the item of "coil ID" in the first record of the coil classification information 11*a* indicates, for example, a receiver coil for a knee to be used mainly for imaging the knee (knee dedicated coil). The ID "BA" registered in the item of "coil ID" in the second record and the ID "BB" registered in the item of "coil ID" in the third record respectively indicate, for example, general-purpose receiver coils (general-purpose coil) to be generally used at the time of imaging. The general-purpose coil is used for imaging relatively large number of regions. The ID "CC" registered in the item of "coil ID" in the fourth record indicates a receiver coil installed in the couch, which is used in such an operation form that is installed on the top board 8*a* of the couch B at all times (couch-installed coil). For example, as an example of the couch-installed coil, a spinal coil that is embedded in the top board 8*a* and is used at the time of imaging the spine such as the cervical spine, thoracic spine, and lumbar spine can be mentioned.

In the item of "coil group", information for identifying whether the receiver coil 6 is a receiver coil for a region (region dedicated coil) to be used mainly at the time of imaging a specific region, or a general-purpose coil, or a couch-installed coil, depending on the type of the receiver coil 6 indicated by the ID registered in the item of "coil ID" is registered.

When the receiver coil 6 indicated by the ID registered in the item of "coil ID" is the region dedicated coil such as the receiver coil for the knee or a receiver coil for the head to be used mainly at the time of imaging the head (head dedicated coil), "A" indicating that the coil is the region dedicated coil is registered in the item of "coil group". For example, "A" is registered in the item of "coil group" of the first record.

When the receiver coil 6 indicated by the ID registered in the item of "coil ID" is the general-purpose coil, "F" indicating that the coil is the general-purpose coil is registered in the item of "coil group". For example, "B" is registered in the item of "coil group" of the second record and the third record.

When the receiver coil 6 indicated by the ID registered in the item of "coil ID" is the couch-installed coil, "C" indicating that the coil is the couch-installed coil is registered in the item of "coil group". For example, "C" is registered in the item of "coil group" of the fourth record.

With regard to the region dedicated coil, the general-purpose coil, and the couch-installed coil, the following types can be considered. For example, when the region dedicated coil is connected to the connector 6*a*, it can be considered that there is a relatively high possibility of imaging a specific region corresponding to the region dedicated coil.

Furthermore, when the region dedicated coil is not connected to the connector 6*a*, and the general-purpose coil is connected to the connector 6*a*, it can be considered that there is a relatively high possibility of imaging a region such as a hand, a leg, a knee, an abdomen, or a pelvis by using the general-purpose coil.

Further, among the region dedicated coil, the general-purpose coil, and the couch-installed coil, when only the couch-installed coil is connected to the connector 6*a*, because only the couch-installed coil is connected to the connector 6a, it can be considered that there is a relatively high possibility of performing imaging by using the couch-installed coil.

Based on the above descriptions, it can be said that information indicating to which group the receiver coil 6 indicated by the ID registered in the item of "coil ID" belongs, among the three groups ("A", "B", and "C") classified based on the possibility degree of being used in imaging is registered in the item of "coil group". Although described later, the three groups are handled in such a manner that "A" has the highest priority (the degree of priority), "B" has the next highest priority, and "C" has the lowest priority, among "A", "B", and "C". That is, the coil classification information 11a includes information of the degree of priority set based on the region that can be imaged by using the receiver coil 6.

In the item of "region 1", among the plurality of regions that can be imaged in imaging using the receiver coil 6 indicated by the ID registered in the item of "coil group", a region mainly imaged by using the receiver coil 6 is registered. For example, as illustrated in the example of FIG. 2, a region "knee" mainly imaged by using the knee dedicated coil is registered in the item of "region 1" of the first record.

Regions "hand", "leg", "knee", "abdomen", and "pelvis" mainly imaged by using the general-purpose coil indicated by the ID "BA" are registered in the item of "region 1" of the second record.

Regions "knee", "abdomen", and "pelvis" mainly imaged by using the general-purpose coil indicated by the ID "BB" are registered in the item of "region 1" of the third record.

Further, regions "cervical spine", "thoracic spine", and "lumbar spine" mainly imaged by using the couch-installed coil indicated by the ID "CC" are registered in the item of "region 1" of the fourth record.

In the item of "region 2", when "A" is registered in the item of "coil group" of the same record, among the regions that can be imaged in imaging using the receiver coil 6 indicated by the ID registered in the item of "coil group", a region other than the regions registered in "region 1", which is imaged relatively frequently is registered. For example, in the item of "region 2" of the first record, among the regions that can be imaged in imaging using the knee dedicated coil, regions "hand" and "leg", which are regions other than the "knee", imaged relatively frequently are registered.

In the item of "region 2", when "B" or "C" is registered in the item of "coil group" of the same record, among the regions that can be imaged in imaging using the receiver coil 6 indicated by the ID registered in the item of "coil group", a region other than the regions registered in "region 1" is registered. For example, in the item of "region 2" of the second record, among the regions that can be imaged in imaging using the general-purpose coil indicated by the ID "BA", a region other than the mainly imaged regions "hand", "leg", "knee", "abdomen", and "pelvis" is registered. In the example of FIG. 2, the region registered in the item of "region 2" of the second record is described as "others". The same applies in the following descriptions.

From the above descriptions, it can be said that when the region registered in the item of "region 1" is compared with the region registered in the item of "region 2", there is a high possibility of imaging the regions registered in the item of "region 1".

In the item of "region 3", when "A" is registered in the item of "coil group" of the same record, among the regions that can be imaged in imaging using the receiver coil indicated by the ID registered in the item of "coil group", a region other than the regions registered in "region 1" and "region 2" is registered.

The MRI apparatus 100 according to the first embodiment displays on the display 10 a screen for causing a user to select the protocol and the imaging condition (a screen for receiving setting of the protocol and the imaging condition from the user) and a screen for causing the user to select the direction and the body posture of the subject S (a screen for receiving setting of the direction and the body posture of the subject S from the user), before performing imaging in the examination of the subject S, so that the user selects the protocol and the imaging condition, and the direction and the body posture of the subject S. The MRI apparatus 100 sets the selected protocol as the protocol executed at the time of imaging, sets the selected imaging condition as the imaging condition at the me of executing the protocol, and sets the selected direction and the body posture of the subject S as the direction and the body posture of the subject S in imaging. The MRI apparatus 100 then sets the direction and the body posture of the subject S to perform imaging by executing the set protocol under the set imaging condition.

An example of a process for causing a user to select a protocol and an imaging condition, which is performed by the MRI apparatus 100 according to the first embodiment, is described here.

Figure 3:
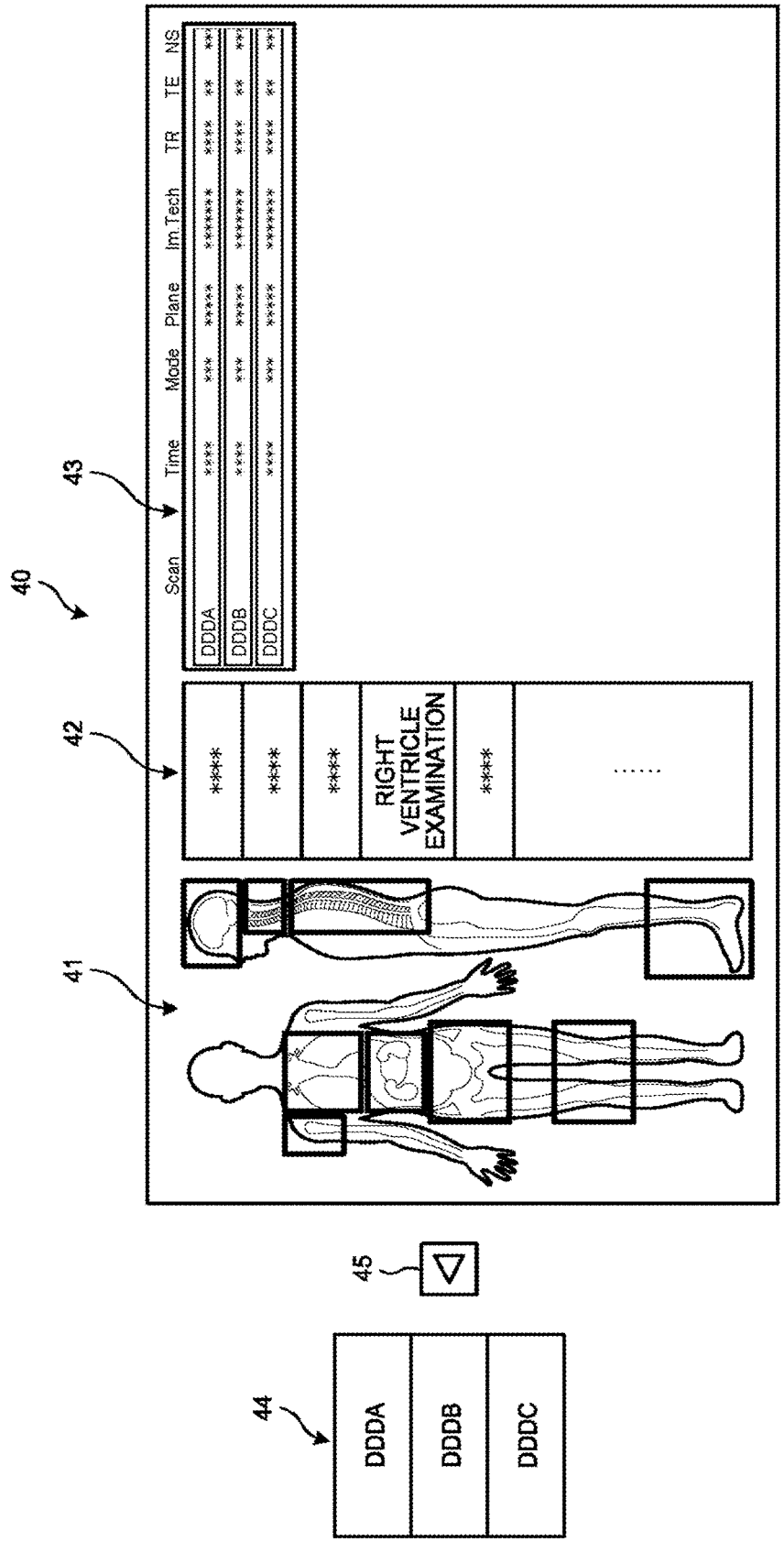
FIG. 3 is a diagram illustrating an example of a screen for causing a user to select a protocol and an imaging condition.

First, the presentation control ion 15c causes the display 10 to display a screen for causing a user to select a protocol and an imaging condition. FIG. 3 is a diagram illustrating an example of a screen for causing a user to select a protocol and an imaging condition. For example, the presentation control function 15c causes to display a screen 40 illustrated in the example in FIG. 3 on the display 10. The screen 40 includes fields 41 to 44 and a button 45.

In the field 41, a human model diagram that receives selection for each imaging region (hereinafter, simply "region") is displayed. In the field 42, a list of generic terms of a group of protocols (a protocol group) for imaging preset with respect to the region selected in the field 41 is displayed. In the field 43, a list of names of the protocols included in the protocol group preset with respect to the generic term selected in the field 42. In the field 43, various imaging conditions such as TE and TR at the time of executing the protocol are displayed in addition to the names of protocols. In the field 44, names of protocols set with respect to the examination are displayed. On the display screen 40, a user selects in order of the region, the protocol group, the protocol, and the imaging condition according to a hierarchical structure, to set the desired protocol to be executed in the examination and the imaging condition of the protocol.

For example, when the user operates the input circuitry 9 to select a rectangle corresponding to "heart" in the field 41, the presentation control function 15c causes to display the list of generic terms of the protocol groups for imaging the "heart" in the field 42. Subsequently, when the user operates the input circuitry 9 to select in the field 42 "right ventricle examination", which is the generic term of the intended protocol group for examining the right ventricle of the heart, the presentation control function 15c causes to display the list of names of the protocols included in the protocol group indicated by the "right ventricle examination" and the imaging conditions in the field 43. In the example of FIG. 3, the presentation control function 15c causes to display various imaging conditions of respective protocols together with the names of the protocols "DDDA", "DDDB", and "DDDC" in the field 43.

The user operates the input circuitry 9 to select at least one of the names of the protocols to be set with respect to the examination and the imaging conditions of the protocol, from the list of the protocol names and the imaging conditions displayed in the field 43, and presses the button 45. A case where the button 45 is pressed after all the protocol names and the imaging conditions displayed in the field 43 are selected is described here. When the button 45 is pressed, the presentation control function 15c causes to display all the selected protocol names in the field 44 and sets all the protocols indicated by the selected names as the protocols to be executed in the examination of the subject S and sets the selected imaging condition as the imaging condition of the protocol. That is, the presentation control function 15c sets the protocol and the imaging condition applied to imaging before execution of imaging using the receiver coil 6. The MRI apparatus 100 receives setting of the protocol and the imaging condition with respect to the examination by the method described above. When the user presses the button 45 in a state where any generic term is selected, among the generic terms of the protocol groups displayed in the field 42, the presentation control function 15c can display in the field 44 all the protocol names displayed in the field 43, and can set all the protocols indicated by the selected name and the selected imaging conditions as the protocols to be executed in the examination of the subject S and the imaging conditions of the protocols.

The MRI apparatus 100 according to the first embodiment performs a narrowing-down display process in which protocols having a high possibility of being selected by a user and the imaging conditions of the protocol are narrowed down and displayed, among a plurality of selectable protocols and imaging conditions of the protocols, at the time of displaying the screen for causing the user to select the protocol and the imaging condition on the display 10. Accordingly, the user selects the protocol to be executed in the examination and the imaging condition of the protocol from the narrowed down protocols and imaging conditions, thereby enabling to set the protocol and the imaging condition. Therefore, according to the MRI apparatus 100 of the first embodiment, setting of the protocol and the imaging condition can be easily performed by the user.

Figure 4:
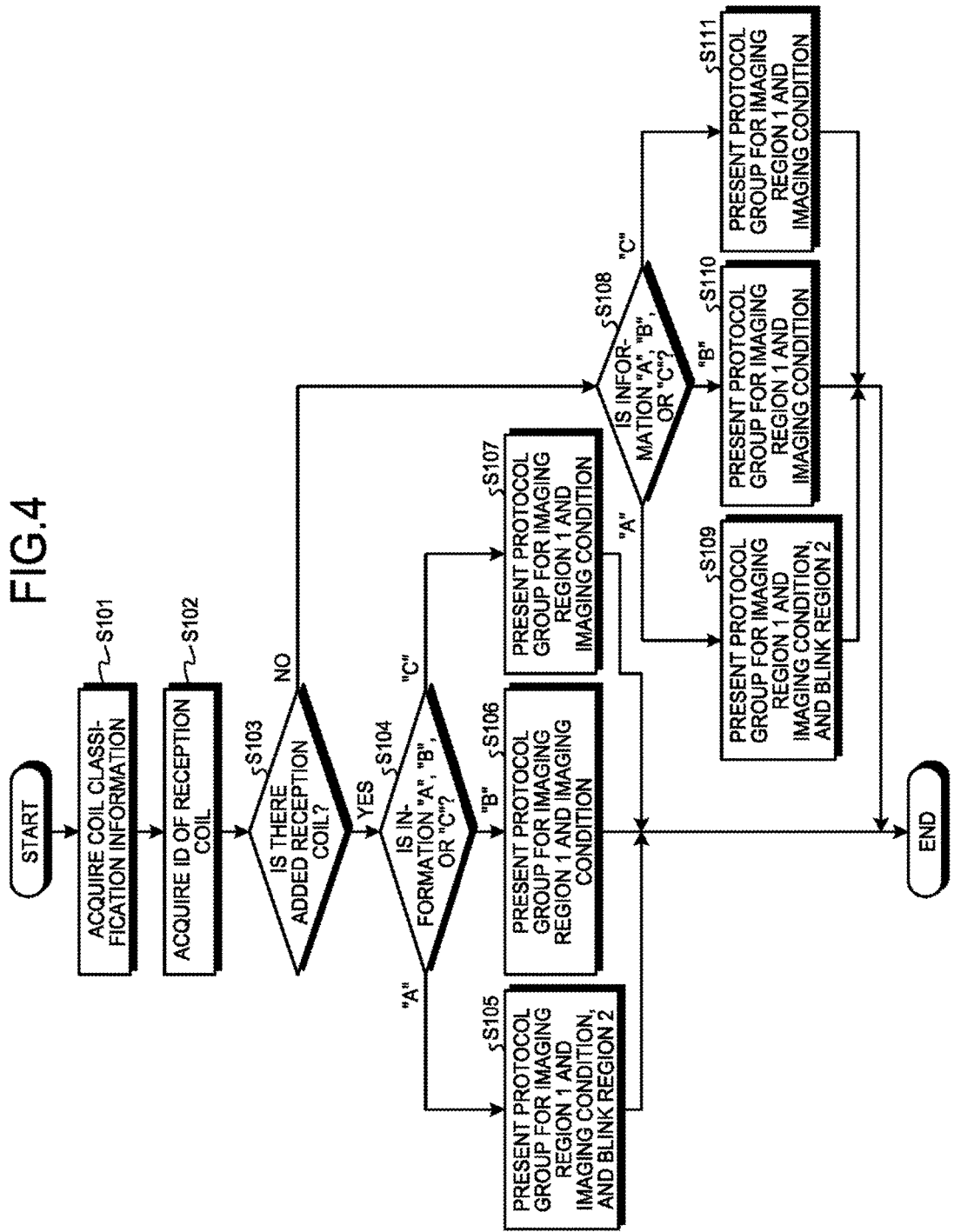
FIG. 4 is a flowchart illustrating a flow of a narrowing-down display process performed by the MRI apparatus according to the first embodiment.

FIG. 4 is a flowchart illustrating a flow of the narrowing-down display process performed by the MRI apparatus according to the first embodiment.

As illustrated in FIG. 4, the acquisition function 15b of the MRI apparatus 100 acquires the coil classification information 11a from the memory circuitry 11 (Step S101).

The acquisition function 15b of the MRI apparatus 100 acquires all the IDs in the current examination memorized in the memory circuitry 11 to acquire the IDs of all the receiver coils 6 being used in the current examination (Step S102). Step S101 and Step S102 are realized, for example, by the processing circuitry 15 that invokes a predetermined program corresponding to the acquisition function 15b from the memory circuitry 11 and executes the program.

The presentation control function 15c compares the IDs of all the receiver coils 6 used in the previous examination with the IDs of all the receiver coils 6 being used in the current examination to determine whether there is a receiver coil 6 newly added in the current examination (Step S103). As described above, the processing circuitry 13 stores the ID of the receiver coil 6 in the memory circuitry 11 for each examination. Therefore, at Step S103, the presentation control function 15c can acquire the IDs of all the receiver coils 6 used in the previous examination from the memory circuitry 11, to compare the acquired IDs of all the receiver coils 6 used in the previous examination with the IDs of all the receiver coils 6 being used in the current examination. At Step S103, for example, if an ID other than the IDs of all the receiver coils 6 used in the previous examination is included in the IDs of the receiver coils 6 being used in the current examination, the presentation control function 15c determines that there is a receiver coil 6 newly added in the current examination, because there is the ID of the receiver coil 6 newly added in the current examination. On the other hand, if the IDs of all the receiver coils 6 being used in the current examination are included in the IDs of all the receiver coils 6 used in the previous examination, the presentation control function 15c determines that there is no receiver coil 6 newly added in the current examination.

The receiver coil 6 newly added in the current examination is a receiver coil purposefully added for the current examination. Therefore, it can be considered that there is a considerably high possibility of using the added receiver coil at the time of performing imaging in the current examination.

When the presentation control function 15c determines that there is a receiver coil 6 newly added in the current examination, the number of receiver coils 6 newly added may be singular or plural.

When there is a receiver coil 6 newly added (YES at Step S103), the presentation control function 15c performs the process described below at Step S104. The process at Step S104 when the number of receiver coils 6 newly added is one is described first. In this case, the presentation control function 15c specifies a record in which the ID of the receiver coil 6 newly added in the current examination is recorded in the item of "coil ID", from all the records in the coil classification information 11a. The presentation control function 15c then determines whether the information registered in the item of "coil group" of the specified record is "A", "B", or "C". In the case of "A", the presentation control function 15c proceeds to Step S105. In the case of "B", the presentation control function 15c proceeds to Step S106. In the case of "C", the presentation control function 15c proceeds to Step S107.

That is, if the newly added receiver coil 6 is the region dedicated coil, the presentation control function proceeds to Step S105. If the newly added receiver coil 6 is the general-purpose coil, the presentation control function 15c proceeds to Step S106. If the newly added receiver coil 6 is the couch-installed coil, the presentation control function 15c proceeds to Step S107.

The process at Step S104 when the number of newly added receiver coils 6 is plural is described next. In this case, the presentation control function 15c performs the process described below for each of the receiver coils 6 newly added in the current examination. That is, the presentation control function 15c specifies a record in which the ID of the receiver coil 6 is recorded in the item of "coil ID", from all the records in the coil classification information 11a. The presentation control function 15c then determines whether the information registered in the item of "coil group" is "A", "B", or "C" for each of the specified records. That is, the presentation control function 15c determines whether the information registered in the item of "coil group" is "A", "B", or "C" for each of the plurality of records.

The presentation control function 15c handles "A", "B", and "C" in such a manner that "A" has the highest priority (the degree of priority), "B" has the next highest priority, and "C" has the lowest priority. In the determination results determined with respect to the plurality of records, if the highest priority is "A", the presentation control function 15c proceeds to Step S105. That is, if there is "A" in the information registered in the item of "coil group" determined with respect to the records, the presentation control function 15c proceeds to Step S105. In other words, if "A" is registered in the item of "coil group" in at least one record among the specified records, the presentation control function 15c proceeds to Step S105.

In the determination results determined with respect to the plurality of records, if the highest priority is "B", the presentation control function 15c proceeds to Step S106. That is, if there is no "A" but there is "B" in the information registered in the item of "coil group" determined with respect to the records, the presentation control function 15c proceeds to Step S106. In other words, if there is no record in which "A" is registered in the item of "coil group", in the specified records, and "B" is registered in the item of "coil group" in at least one record, the presentation control function 15c proceeds to Step S106.

In the determination results determined with respect to the plurality of records, if the highest priority is "C", the presentation control function 15c proceeds to Step S107. That is, if there is no "A" or "B" and there is only "C" in the information registered in the item of "coil group" determined with respect to the records, the presentation control function 15c proceeds to Step S107. In other words, if there is no record in which "A" or "B" is registered in the item of "coil group", in the specified records, and "C" is registered in the item of "coil group" in at least one record, the presentation control function 15c proceeds to Step S107.

That is, if there is the region dedicated coil in the plurality of receiver coils 6 newly added, the presentation control function 15c proceeds to Step S105. If there is no region dedicated coil but there is the general-purpose coil in the receiver coils newly added, the presentation control function 15c proceeds to Step S106. Further, if all the receiver coils 6 newly added are the couch-installed coils, the presentation control function 15c proceeds to Step S107.

At Step S105, the presentation control function 15c selects in the field 41 a region registered in the item of "region 1" of the record in which "A" is registered in the item of "coil group", and causes to display the list of generic terms of the protocol groups preset with respect to the selected region in the field 42 as the list of generic terms of candidates for the protocol groups. The presentation control function 15c selects all the generic terms of the candidates for the protocol groups displayed in the field 42, and causes to display the list of names of the protocols included in the candidates for the protocol groups indicated by the selected generic terms as the list of names of the protocol candidates in the field 43, and display the imaging conditions of the candidates for the respective protocols in the field 43 as the candidates for the imaging conditions.

Figure 5:
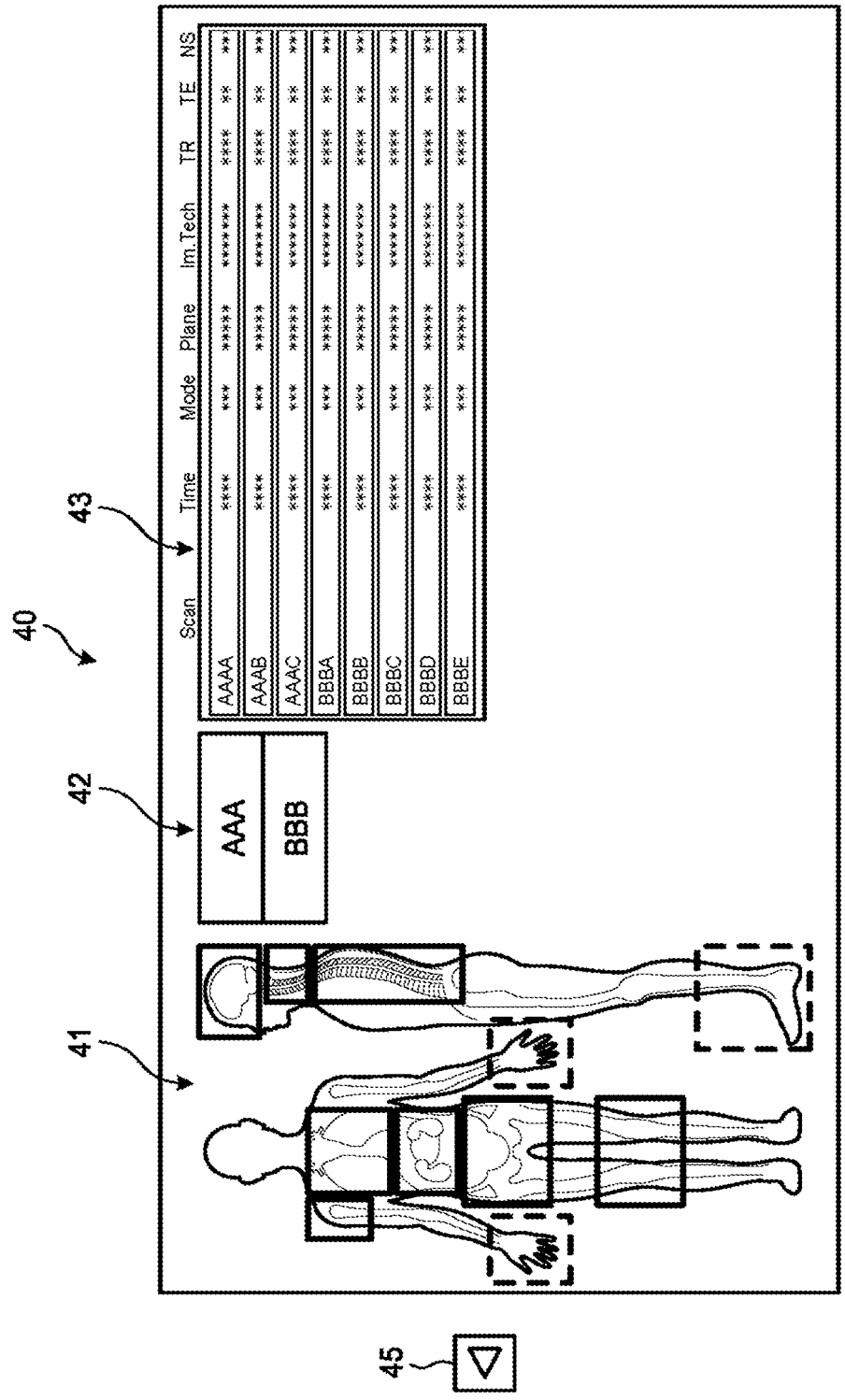
FIG. 5 is a diagram illustrating an example of an image indicating candidates for protocols and candidates for imaging conditions that have been narrowed down.

FIG. 5 is a diagram illustrating an example of an image indicating candidates for protocols and candidates for imaging conditions that have been narrowed down. For example, as illustrated in the example in FIG. 5, at Step S105, the presentation control function 15c selects the region "knee" registered in "region 1" of the first record in which "A" is registered in the item of "coil group" illustrated in the previous example in FIG. 2, and causes to display the list of generic terms "A" and "BBB" of the protocol groups preset to the selected region "knee", as the list of generic terms of the candidates for the protocol groups in the field 42. The presentation control function 15c then selects all the generic terms " " and "BBB" of the candidates for the protocol groups displayed in the field 42. The presentation control function 15c causes to display names "AAAA", "AAAB", and "AAAC" of the protocols included in the candidates for the protocol group indicated by the selected generic term "AAA" as the names of the protocol candidates in the field 43. The presentation control function 15c also displays names "BBBA", "BBBB", "BBBC", "BBBD", and "BBBE" of the protocols included in the candidates for the protocol group indicated by the selected generic term "BBB" as the names of the protocol candidates in the field 43. The presentation control function 15c also causes to display the imaging conditions of the respective protocols as the candidates for the imaging conditions in the field 43.

At Step S105, for example, the presentation control function 15c highlights in the field 41 the region registered in the item of "region 2" of the record in which "A" is registered in the item of "coil group". For example, the presentation control function 15c causes to blink the region.

For example, at Step S105, the presentation control function 15c selects regions "hand" and "leg" registered in "region 2" of the first record in which "A" is registered in the item of "coil group". As illustrated in an example in FIG. 5, the presentation control function 15c causes to blink a rectangle corresponding to the selected region "hand" in the field 41. The presentation control function 15c also causes to blink a rectangle corresponding to the selected region "leg" in the field 41. Upon completion of the process at Step S105, the presentation control function 15c finishes the narrowing-down display process.

According to the MRI apparatus 100 of the first embodiment, with regard to the region dedicated coil having a considerably high possibility of being used at the time of performing imaging in the current examination, which is newly added in the current examination, the candidates for the protocol groups for imaging a specific region having a relatively high possibility of being imaged and the candidates for the imaging conditions of the respective protocols can be presented to a user by the process at Step S105 described above. Further, according to the MRI apparatus 100, with regard to the region dedicated coil having the considerably high possibility of being used at the time of performing imaging in the current examination, a region having a relatively high possibility of being imaged can be presented to the user in the field 41, by the process at Step S105 described above. Accordingly, according to the MRI apparatus 100, at Step S105, because the protocols and the imaging conditions are narrowed down to present the candidates for the protocols and the candidates for the imaging conditions to the user, the user can easily perform setting of the protocol and the imaging condition.

At Step S106, for example, the presentation control function 15c selects in the field 41 a region registered in the item of "region 1" of a record in which "B" is registered in the item of "coil group", and causes to display a list of generic terms of the protocol groups preset to the selected region in the field 42 as the list of generic terms of the candidates for the protocol groups. The presentation control function 15c selects all the generic terms of the candidates for the protocol groups displayed in the field 42, and causes to display in the field 43 the list of the protocol names included in the candidates for the protocol groups indicated by the selected generic terms as the list of names of the protocol candidates, and display the candidates for the imaging conditions of the respective protocols in the field 43 as the candidates for the imaging conditions. Upon completion of the process at Step S106, the presentation control function 15c finishes the narrowing-down display process.

According to the MRI apparatus 100, with regard to the general-purpose coil having a considerably high possibility of being used at the time of performing imaging in the current examination, which is newly added in the current examination, the candidates for the protocol groups for imaging a region having a relatively high possibility of being imaged and the candidates for the imaging conditions of the respective protocols can be presented to the user by the process at Step S106 described above. Therefore, according to the MRI apparatus 100, because the protocols and the imaging conditions are narrowed down to present the candidates for the protocols and the candidates for the imaging conditions to the user at Step S106, the user can easily perform setting of the protocol and the imaging condition.

At Step S107, for example, the presentation control function 13c selects in the field 41 a region registered in the item of "region 1" of a record in which "C" is registered in the item of "coil group", and causes to display a list of generic terms of the protocol groups preset to the selected region in the field 42 as the list of generic terms of the candidates for the protocol groups. The presentation control function 15c selects all the generic terms of the candidates for the protocol groups displayed in the field 42, and causes to display in the field 43 the list of the protocol names included in the candidates for the protocol groups indicated by the selected generic terms as the list of names of the protocol candidates, and display the candidates for the imaging conditions of the respective protocols in the field 43 as the candidates for the imaging conditions. Upon completion of the process at Step S107, the presentation control function 15c finishes the narrowing-down display process.

According to the MRI apparatus 100, with regard to the couch-installed coil having a considerably high possibility of being used at the time of performing imaging in the current examination, which is newly added in the current examination, the candidates for the protocol groups for imaging a region having a relatively high possibility of being imaged and the candidates for the imaging conditions of the respective protocols can be presented to the user by the process at Step S107 described above. Therefore, according to the MRI apparatus 100, because the protocols and the imaging conditions are narrowed down to present the candidates for the protocols and the candidates for the imaging conditions to the user at Step S107, the user can easily perform setting of the protocol and the imaging condition.

At Steps S101 to S107 described above, in the case where an examination being a unit for performing the protocol group is to be performed plural times, at the time of performing the current examination (the second examination) after the previous examination (the first examination), the acquisition function 15b acquires information of the RF coil newly added in the current examination at the time of performing the current examination. In the narrowing-down display process, the display 10 displays at least one protocol narrowed down based on the information of the RF coil newly added in the current examination.

If there is no newly added receiver coil 6 (NO at Step S103), the presentation control function 15c performs a process described below at Step S108.

At Step S108, all IDs of the receiver coils 6 being used in the current examination, which have been acquired at Step S102, are used. However, the number of receiver coils 6 being used in the current examination may be singular or plural.

The process at Step S108 when the number of all the receiver coils 6 being used in the current examination is one is described first. In this case, the presentation control function 15c specifies a record in which the ID of the receiver coil 6 being used in the current examination is registered in the item of "coil ID", from all the records in the coil classification information 11a. The presentation control function 15c then determines whether the information registered in the item of "coil group" of the specified record is "A", "B", or "C". In the case of "A", the presentation control function 15c proceeds to Step S109. In the case of "B", the presentation control function 15c proceeds to Step S110. In the case of "C", the presentation control function 15c proceeds to Step S111.

That is, if the receiver coil 6 being used in the current examination is the region dedicated coil, the presentation control function 15c proceeds to Step S109. If the receiver coil 6 is the general-purpose coil, the presentation control function 15c proceeds to Step S110. If the receiver coil 6 is the couch-installed coil, the presentation control function 15c proceeds to Step S111.

The process at Step S108 when the number of all the receiver coils 6 being used in the current examination is plural is described next. In this case, the presentation control function 15c performs a process described below for each of the receiver coils 6 being used in the current examination. That is, the presentation control function specifies a record in which the ID of the receiver coil 6 is registered in the item of "coil ID" from all the records in the coil classification information 11a. The presentation control function 15c then determines whether the information registered in the item of "coil group" is "A", "B", or "C" for each of the specified records.

The presentation control function 15c handles "A", "B", and "C" in such a manner that "A" has the highest priority, "B" has the next highest priority, and "C" has the lowest priority. In the determination results determined with respect to the plurality of records, if the highest priority is "A", the presentation control function 15c proceeds to Step S109.

When the highest priority is "B" in the determination result determined with respect to the records, the presentation control function 15c proceeds to Step S110.

When the highest priority is "C" in the determination result determined with respect to the records, the presentation control function 15c proceeds to Step S111.

That is, when there is the region dedicated coil in the receiver coils 6 used at the time of performing imaging in the current examination, the presentation control function 15c proceeds to Step S109. When there is no region dedicated coil but there is the general-purpose coil in the receiver coils 6 used at the time of performing imaging in the current examination, the presentation control function 15c proceeds to Step S110. When all the receiver coils 6 used at the time of performing imaging in the current examination are the couch-installed coils, the presentation control function 15c proceeds to Step S111.

At Step S109, the presentation control function 15c performs the same process as the process at Step S105. For example, at Step S109, the presentation control function 15c selects in the field 41 a region registered in the item of "region 1" of the record in which "A" is registered in the item of "coil group", and causes to display the list of generic terms of the protocol groups preset to the selected region in the field 42 as the list of generic terms of the candidates for the protocol groups. The presentation control function 15c selects all the generic terms of the candidates for the protocol groups displayed in the field 42, and causes to display the list of names of the protocols included in the candidates for the protocol groups indicated by the selected generic terms as the list of names of the protocol candidates in the field 43, and display the imaging conditions of the respective protocols in the field 43 as the candidates for the imaging conditions. At Step S109, for example, the presentation control function 15c highlights in the field 41 a region registered in the item of "region 2" of the record in which "A" is registered in the item of "coil group". Upon completion of the process at Step S109, the presentation control function 15c finishes the narrowing-down display process.

According to the MRI apparatus 100 of the first embodiment, with regard to the region dedicated coil having a relatively high possibility of being used at the time of performing imaging in the current examination, the candidates for the protocol groups for imaging a specific region having a relatively high possibility of being imaged and the candidates for the imaging conditions of the respective protocols can be presented to a user by the process at Step S109 described above. Further, according to the MRI apparatus 100, with regard to the region dedicated coil having the relatively high possibility of being used at the time of performing imaging in the current examination, a region having a relatively high possibility of being imaged can be presented to the user in the field 41 by the process at Step S109 described above. Accordingly, according to the MRI apparatus 100, at Step S109, because the protocols and the imaging conditions are narrowed down to present the candidates for the protocols and the candidates for the imaging conditions to the user, the user can easily perform setting of the protocol and the imaging condition.

At Step S110, the presentation control function 15c performs the same processing as the process at Step S106. For example, the presentation control function 15c selects in the field 41 a region registered in the item of "region 1" of the record in which "B" is registered in the item of "coil group", and causes to display a list of generic terms of the protocol groups preset to the selected region in the field 42 as the list of generic terms of candidates for the protocol groups. The presentation control function 15c selects all the generic terms of the candidates for the protocol groups displayed in the field 42, and causes to display in the field 43 the list of the protocol names included in the candidates for the protocol groups indicated by the selected generic terms as the list of names of the protocol candidates, and display the candidates for the imaging conditions of the respective protocols in the field 43 as the candidates for the imaging conditions. Upon completion of the process at Step S110, the presentation control function 15c finishes the narrowing-down display process.

According to the MRI apparatus 100, with regard to the general-purpose coil having a relatively high possibility of being used at the time of performing imaging in the current examination, the candidates for the protocol groups for imaging a region having a relatively high possibility of being imaged and the candidates for the imaging conditions of the respective protocols can be presented to the user by the process at Step S110 described above. Therefore, according to the MRI apparatus 100, because the protocols and the imaging conditions are narrowed down to present the candidates for the protocols and the candidates for the imaging conditions to the user at Step S110, the user can easily perform setting of the protocol and the imaging condition.

At Step S111, the presentation control function 15c performs the same processing as the process at Step S107. For example, the presentation control function 15c selects in the field 41 a region registered in the item of "region 1" of the record in which "C" is registered in the item of "coil group", and causes to display a list of generic terms of the protocol groups preset to the selected region in the field 42 as the list of generic terms of the candidates for the protocol groups. The presentation control function 15c selects all the generic terms of the candidates for the protocol groups displayed in the field 42, and causes to display in the field 43 the list of the protocol names included in the candidates for the protocol groups indicated by the selected generic terms as the list of names of the protocol candidates, and display the candidates for the imaging conditions of the respective protocols in the field 43. Upon completion of the process at Step S111, the presentation control function 15c finishes the narrowing-down display process. Step S103 to Step S111 are realized, for example, by the processing circuitry 15 that invokes a predetermined program corresponding to the presentation control function 15c from the memory circuitry 11 and executes the program.

According to the MRI apparatus 100, with regard to the couch-installed coil having a relatively high possibility of being used at the time of performing imaging in the current examination, the candidates for the protocol groups for imaging a region having a relatively high possibility of being imaged and the candidates for the imaging conditions of the respective protocols can be presented to the user by the process at Step S111 described above. Therefore, according to the MRI apparatus 100, because the protocols and the imaging conditions are narrowed down to present the candidates for the protocols and the candidates for the imaging conditions to the user at Step S111, the user can easily perform setting of the protocol and the imaging condition.

When there are a plurality of protocols that can be selected as a protocol applied to imaging, the display 10 displays at least one protocol narrowed down as a protocol applicable to imaging, from the plurality of protocols based on the coil classification information 11a, by the respective processes at Steps S105 to S107, and S109 to S111. For example, when the plurality of receiver coils 6 are connected to the apparatus body described above, the display 10 displays at least one protocol narrowed down based on the priority information included in the coil classification information 11a.

The MRI apparatus 100 according to the first embodiment has been described. According to the MRI apparatus 100 according to the first embodiment, a user can easily set the imaging condition as described above.

First Modification of First Embodiment

As described above, the presentation control function 15c of the MRI apparatus 100 displays a screen for causing the display 10 to display a screen for a user to select the body posture of the subject S (a screen for receiving setting of the body posture of the subject S from the user) on the display 10, before performing imaging in the examination of the subject S, so that the user selects the body posture of the subject S. The presentation control function 15c sets the selected body posture of the subject S as the body posture of the subject S in imaging. The MRI apparatus 100 assumes that the body posture of the subject S is the set body posture to perform imaging.

The presentation control function 15c of the MRI apparatus 100 can cause the display 10 to display the candidates for the body posture of the subject S from the body postures of the subject S, in which a plurality of postures can be considered, at the time of causing to display the screen for selecting the body posture of the subject S on the display 10. Such an embodiment is described as a first modification of the first embodiment.

Figure 6A:
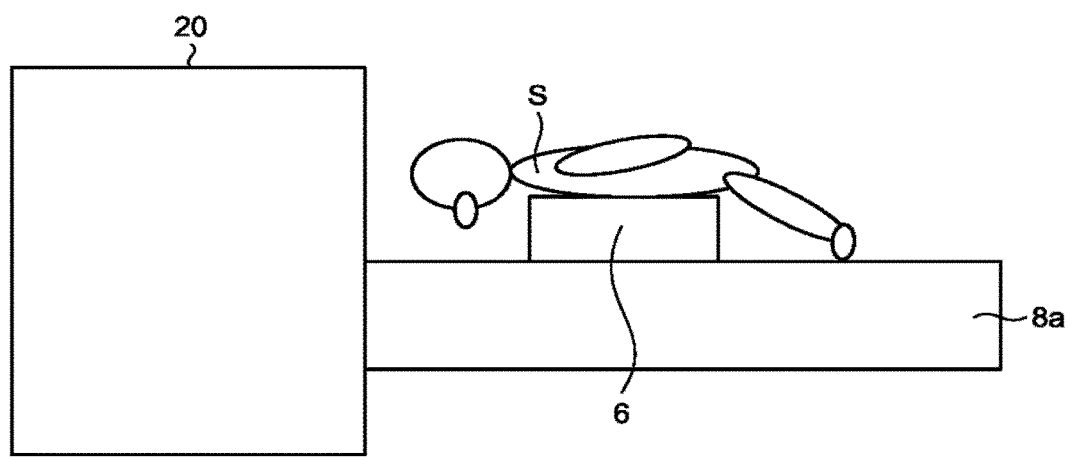
FIG. 6A is an explanatory diagram of an MRI apparatus according to a first modification of the first embodiment.
Figure 6B:
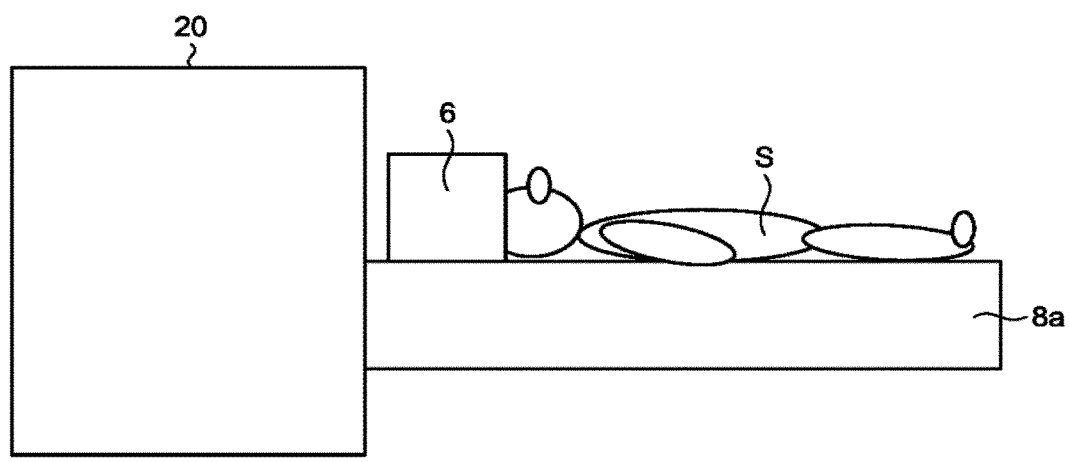
FIG. 6B is an explanatory diagram of the MRI apparatus according to the first modification of the first embodiment.

FIGS. 6A and 6B are explanatory diagrams of the MRI apparatus 100 according to the first modification. A receiver coil 6 for a chest (chest dedicated coil) is illustrated in an example of FIG. 6A. As illustrated in the example in FIG. 6A, when the receiver coil 6 is connected to a connector 6a (not illustrated in FIG. 6A), the body posture of the subject S is a prone posture.

A receiver coil 6 for the head (head dedicated coil) is illustrated in an example of FIG. 6B. As illustrated in the example in FIG. 6B, when the receiver coil 6 is connected to a connector 6a (not illustrated in FIG. 6B), the body posture of the subject S is a supine posture.

As described above, the posture of the subject S may be uniquely decided according to the type of the receiver coil 6. Therefore, an item of "body posture" in which the body posture of the subject S is registered is newly provided in the coil classification information 11a according to the first modification. FIG. 7 is a diagram illustrating an example of the data structure of the coil classification information 11a according to the first modification. When being compared with the coil classification information 11a illustrated in the example in FIG. 2, the item of "body posture" is newly added to the coil classification information 11a illustrated in the example in FIG. 7. An ID "DA" illustrated in the example in FIG. 7 indicates the receiver coil 6 for the chest. An ID "DB" illustrated in the example in FIG. 7 indicates the receiver coil 6 for the head.

The body posture of the subject S when imaging is performed by using a coil indicated by the ID registered in "coil ID" of the same record is registered in the item of "body posture". For example, in the item of "body posture" of the first record in the coil classification information 11a in FIG. 7, a body posture "prone posture" of the subject S when imaging is performed by using the chest receiver coil 6 indicated by the ID "DA" is registered. In the item of "body posture" of the second record of the coil classification information 11a in FIG. 7, a body posture "supine posture" of the subject S when imaging is performed by using the head receiver coil 6 indicated by the ID "DB" is registered.

The presentation control function 15c according to the first modification performs the following processing when a screen for selecting the body posture of the subject S is displayed on the display 10. That is, the presentation control function 15c acquires all IDs in the current examination memorized in the memory circuitry 11. The presentation control function 15c performs the following processing for each of the acquired IDs. That is, the presentation control function 15c specifies a record in which the ID is registered in the item of "coil ID" from all the records in the coil classification information 11a. The presentation control function 15c then specifies records in which the body posture of the subject S is registered in the item of "body posture" from a plurality of specified records. The presentation control function 15c acquires the body posture registered in the item of "body posture" of the specified record. For example, the presentation control function 15c acquires the body posture "prone posture". The presentation control function 15c causes to display the acquired body posture on the screen for selecting the body posture of the subject S as a candidate for the body posture. For example, the presentation control function 15c causes to display the acquired body posture "prone posture" on the screen for selecting the body posture of the subject S, as the candidate for the body posture. The candidate for the body posture is selected or corrected by a user.

As described above, the MRI apparatus 100 according to the first modification presents to the user the candidate for the body posture narrowed down from a plurality of body postures of the subject S, which can be considered. Accordingly, according to the MRI apparatus 100 of the first modification, the user can easily set the body posture of the subject S. The body posture of the subject S is an example of the imaging condition.

Second Modification of First Embodiment

Even in the case of the same type of receiver coil 6, the direction of the subject S may be changed depending on the position at which the receiver coil 6 is connected. Therefore, at the time of displaying on the display 10 a screen for specifying the direction of the subject S that changes depending on the position at which the receiver coil 6 is connected and selecting the direction of the subject the MRI apparatus 100 can present the specified direction of the subject S to a user as the candidate for the direction of the subject S. Such an embodiment is described as a second modification of the first embodiment.

Figure 8A:
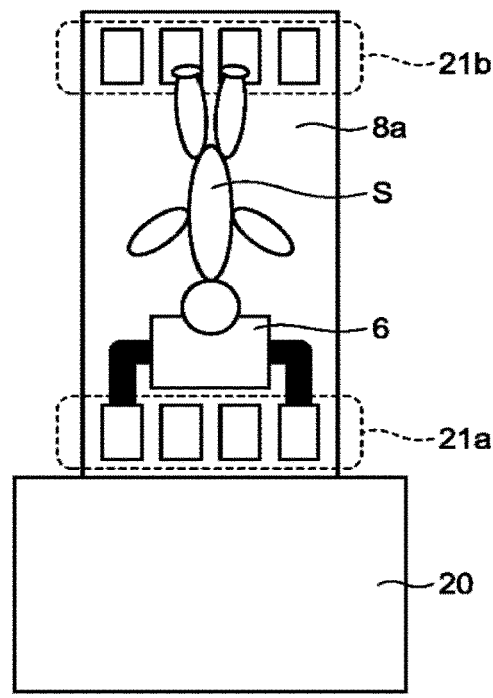
FIG. 8A is an explanatory diagram of an example of a second modification of the first embodiment.
Figure 8B:
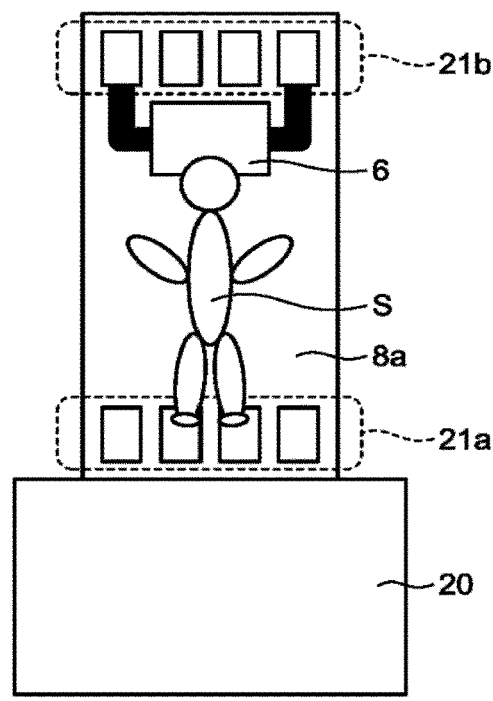
FIG. 8B is an explanatory diagram of an example of the second modification of the first embodiment.

FIGS. 8A and 8B are explanatory diagrams of examples of the second modification of the first embodiment. In the examples illustrated in FIGS. 8A and 8B, a top plate 8a is illustrated in which a port group 21a and a port group 21b that can be connected with the head receiver coil 6 are provided. The port group 21a is provided from the center of the top plate 8a in the longitudinal direction on the side where a bore 20 is located. The port group 21b is provided from the center of the top plate 8a in the longitudinal direction on the side opposite to the side where the bore 20 is located. When the head receiver coil 6 is connected to the port group 21a, the receiver coil 6 is connected to the receiver circuitry 7 via the port group 21a. When the head receiver coil 6 is connected to the port group 21b, the receiver coil 6 is connected to the receiver circuitry 7 via the port group 21b.

As illustrated in the example of FIG. 8A, when the head receiver coil 6 is connected to the port group 21a, the direction of the subject S becomes a condition in which the head can be carried into the bore 20, that is, a head first condition. On the other hand, as illustrated in the example of FIG. 8E, when the head receiver coil 6 is connected to the port group 21b, the direction of the subject S becomes a in which the legs can be carried into the bore 20, that is, a foot first condition. In this manner, the direction of the subject S is changed depending on the position at which the head receiver coil 6 is connected to the port group.

FIG. 8C is a diagram illustrating an example of a data structure of the coil classification information 11a according to the second modification. An item "direction" is provided in the coil classification information 11a illustrated in the example of FIG. 8C. The ID "DB" illustrated in the example of FIG. 8C indicates a head receiver coil 6.

In the item of "direction", the ID indicating the port group connected with the receiver coil 6 indicated by the ID registered in the item of "coil ID" of the same record, and the direction of the subject S when the receiver coil 6 is connected to the port group indicated by the ID are registered in association with each other. For example, in the item "direction" of the first record in the coil classification information 11a in FIG. 8C, an ID "P" indicating the port group 21a connected with the head receiver coil 6 indicated by the ID "DB", and the direction of the subject S "head first" when the head receiver coil 6 is connected to the port group 21a indicated by the ID "P" are registered in association with each other. Further, in the item "direction" of the first record, an ID "Q" indicating the port group 21b connected with the head receiver coil 6 indicated by the ID "DB", and the direction of the subject S "foot first" when the head receiver coil 6 is connected to the port group 21b indicated by the ID "Q" are registered in association with each other.

The presentation control function 15c according to the second modification performs the following processing when the screen for selecting the direction of the subject S is displayed on the display 10. That is, the presentation control function 15c acquires all IDs in the current examination memorized in the memory circuitry 11. The presentation control function 15c performs the following processing for each of the acquired IDs. That is, the presentation control function 15c specifies a record in which the ID is registered in the item of "coil ID" from all the records in the coil classification information 11a. The presentation control function 15c then specifies records in which the ID indicating the port group and the direction of the subject S are registered in the item of "direction" in association with each other, from a plurality of specified records. The presentation control function 15c refers to the correspondence relation between the ID of the port group and the direction of the subject S, registered in the item of "direction" of the specified record to acquire the corresponding direction of the subject S from the ID of the port group currently connected with the head receiver coil 6. For example, the presentation control function 15c acquires "head first" form the ID "P" of the port group. The presentation control function 15c causes to display the acquired direction on the screen for selecting the direction of the subject S as a candidate for the direction. For example, the presentation control function 15c causes to display the acquired direction "head first" on the screen for selecting the direction of the subject S as the candidate for the direction. The candidate for the direction is selected or corrected by a user.

As described above, the MRI apparatus 100 according to the second modification presents to the user the candidates for the direction narrowed down from a plurality of directions of the subject S, which can be considered. Accordingly, according to the MRI apparatus 100 of the second modification, the user can easily set the direction of the subject S. The direction of the subject S is an example of the imaging condition.

Third Modification of First Embodiment

Figure 9:
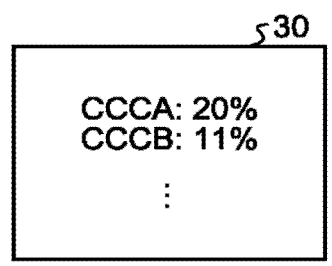
FIG. 9 is an explanatory diagram of a process performed by an MRI apparatus according to a third modification of the first embodiment.

The presentation control function 15c of the MRI apparatus 100 can regularly calculate the use history of the protocol including the execution frequency of the protocol executed in the past examinations. When displaying the protocol candidates in the field 43, the presentation control function 15c can determine a descending order according to the execution frequency as the order of the protocol candidates to be displayed in the field 43, so that the protocol candidates are displayed from the top of the field 43 in the determined order and the candidates for the imaging condition are displayed. FIG. 9 is an explanatory diagram of the process performed by the MRI apparatus 100 according to the third modification. For example, as illustrated in the example in FIG. 9, the presentation control function 15c calculates the execution frequency of the protocol indicated by the ID "CCCA" as "20%", the execution frequency of the protocol indicated by the ID "CCCB" as "11%", and the like, and calculates a use history 30 of the protocol including the calculated execution frequency of the protocol. When displaying the protocol candidates in the field 43, the presentation control function 15c refers to the use history 30 of the protocol to determine the descending order according to the execution frequency as the order of the protocol candidates to be displayed in the field 43. That is, the presentation control function 15c decides a presentation order (a display order) of the candidates for the protocols and the candidates for the imaging conditions, based on the use history 30 of the protocol. The presentation control function 15c causes to display the protocol candidates from the top of the field 43 and display the candidates for the imaging conditions of the respective protocol candidates in the decided order. That is, the presentation control function 15c controls so that the protocol candidates and the candidates for the imaging conditions are presented according to the decided presentation order. In this manner, the presentation control function 15c causes to display the plurality of protocols narrowed down based on the coil classification information 11a in the field 43, based on the display order based on the use history 30 of the protocols. Accordingly, the display 10 displays the protocols narrowed down based on the coil classification information 11a according to the display order based on the use history 30 of the protocols.

Further, the presentation control function 15c can regularly calculate the execution frequency of the protocol group executed in the past examination, and at the time of display of the candidates for the protocol groups in the field 42, can decide the descending order according to the execution frequency as the order of candidates for the protocol groups to be displayed in the field 42, and causes to display the candidates for the protocol groups from the top of the field 42 in the decided order.

The presentation control function 15c can regularly calculate the imaging frequency of the region imaged in the past examination, and at the time of display of the protocol candidates, can cause to display only the candidate for the protocol to be executed at the time of imaging the region having the highest imaging frequency in the field 43 and display the imaging condition of the protocol in the field 43. Accordingly, the display 10 displays the protocol to be executed at the time of imaging the region having the highest imaging frequency of the imaging frequencies, among the protocols that can be selected as the protocol to be applied to imaging. The presentation control function 15c can include the calculated imaging frequency in the use history of the protocol described above.

At the time of display of the protocol candidates, the presentation control function 15c can cause to display in the field 43 only the candidate for the protocol to be executed at the time of imaging the region examined last time, among the candidates for the protocols, and display the imaging condition of the protocol in the field 43. Accordingly, the display 10 displays the protocol to be executed at the time of imaging the imaging region examined last time, among the protocols that can be selected as the protocol to be applied to imaging. The presentation control function 15c can include the information of the region examined last time in the use history of the protocol described above. Further, the presentation control function 15c can refer to the information of the region examined last time included in the use history of the protocol, at the time of display of the protocol candidates.

Fourth Modification of First Embodiment

The MRI apparatus 100 can acquire the information of the receiver coil 6 connected to the connector 6a without using the coil IL). Such an embodiment is described as a fourth modification of the first embodiment.

Figure 10A:
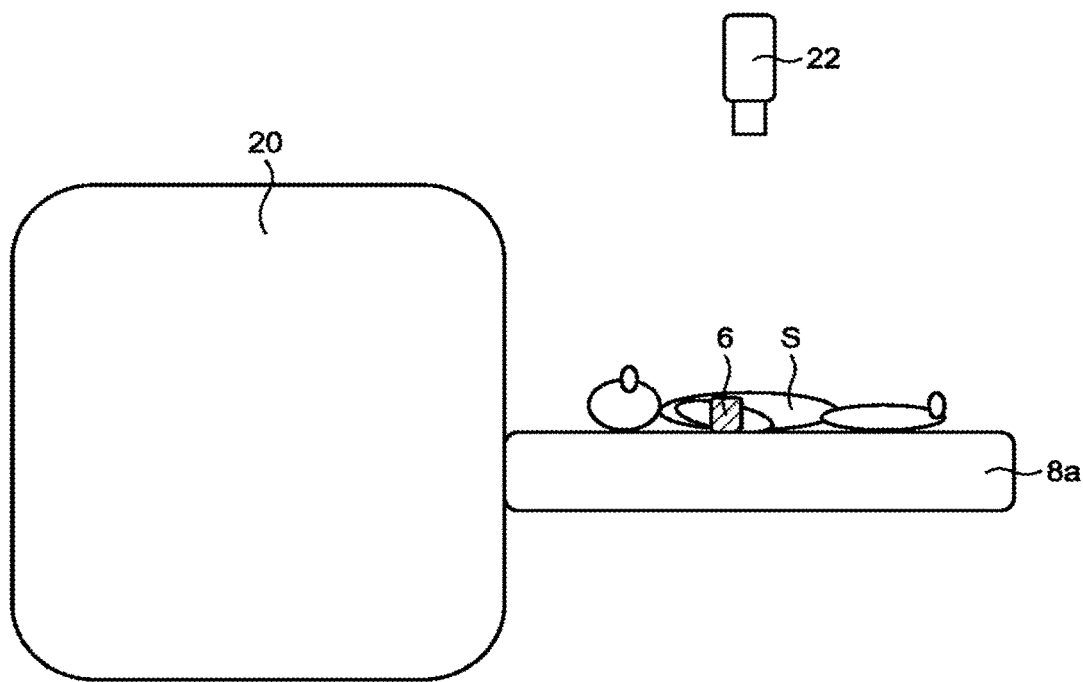
FIG. 10A is an explanatory diagram of a fourth modification of the first embodiment.
Figure 10B:
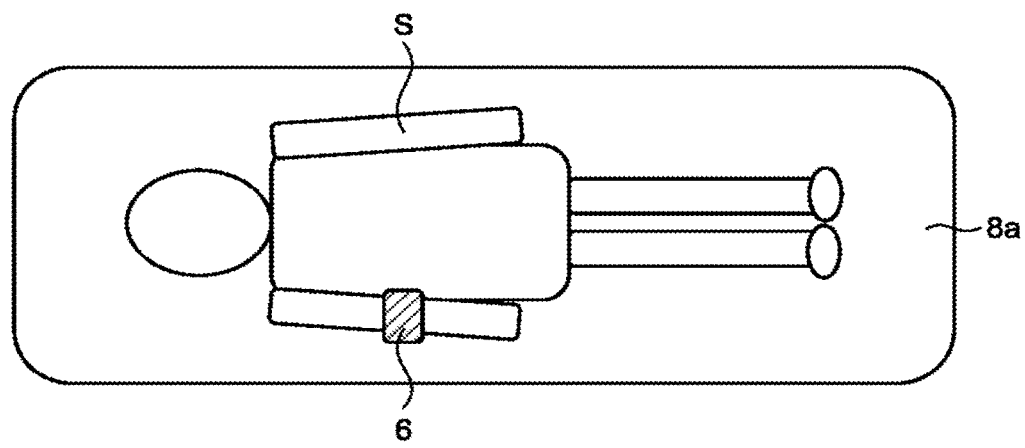
FIG. 10B is an explanatory diagram of the fourth modification of the first embodiment.

FIGS. 10A and 10B are explanatory diagrams of the fourth modification. As illustrated in examples in FIGS. 10A and 10S, a subject S is placed on the top board 8a with the head facing the bore 20. In the example in FIG. 10A, a case where the receiver coil 6 is connected to a connector (not illustrated) is illustrated. In this case, as illustrated in example in FIG. 10A, a camera 22 is provided in the fourth modification.

The camera 22 is provided at a position and in a posture that the receiver coil 6 and the entire subject S can be imaged. The camera 22 outputs an image in which the receiver coil 6 and the subject S are visualized to the presentation control function 15c according to the fourth modification.

Upon reception of an image, the presentation control function 15c recognizes the subject S and the receiver coil 6 from the received image by image recognition. At this time, the presentation control function 15c also recognizes the type of the receiver coil 6. The presentation control function 15c determines the place on the subject S where the receiver coil 6 is attached. The presentation control function 15c then estimates in which region the place on the subject S is. The presentation control function 15c causes to display the list of generic terms of the protocol groups preset with respect to the estimated region in the field 42 on the screen 40, as the list of generic terms of the candidates for the protocol groups. The presentation control function 15c selects all the generic terms of the candidates for the protocol groups displayed in the field 42, and causes to display the list of names of the protocols included in the candidates for the protocol groups indicated by the selected generic terms as the list of names of the protocol candidates in the field 43, and display the imaging conditions of the respective protocols in the field 43 as the candidates for the imaging conditions. Further, the presentation control function 15c automatically sets the imaging area so that the recognized receiver coil 6 and the estimated region are included. In this manner, the MRI apparatus 100 according to the fourth modification presents the protocol candidates and the candidates for the imaging conditions to a user.

Fifth Modification of First Embodiment

Figure 11A:
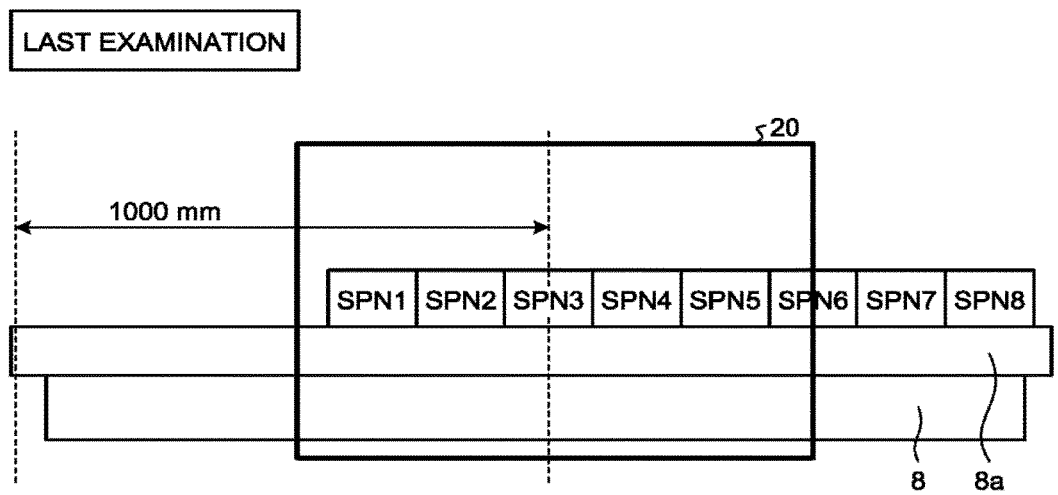
FIG. 11A is an explanatory diagram of an example of processing performed by an MRI apparatus according to a fifth modification of the first embodiment.
Figure 11B:
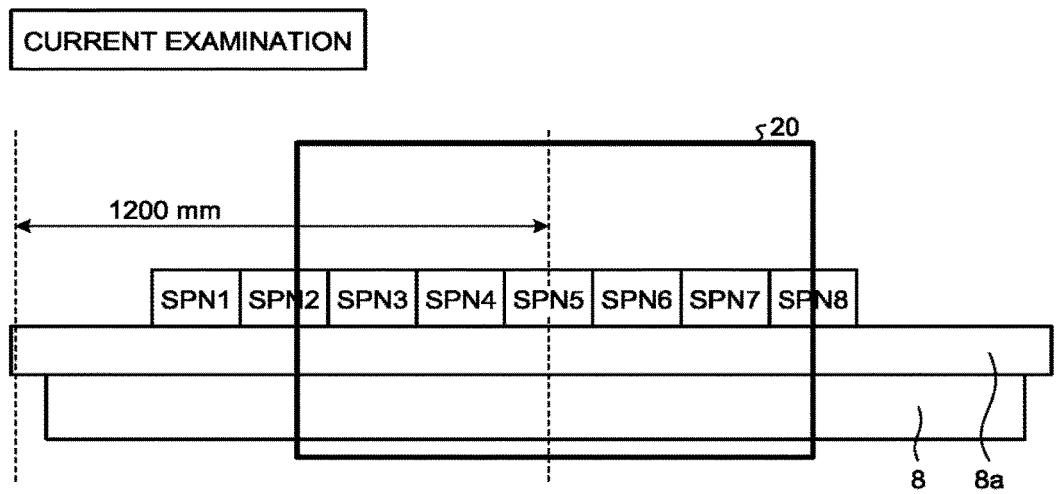
FIG. 11B is an explanatory diagram of an example of processing performed by the MRI apparatus according to the fifth modification of the first embodiment.

A fifth modification of the first embodiment is described next. FIGS. 11A and 11B are explanatory diagrams of examples of processing performed by the MRI apparatus 100 according to the fifth modification. In the examples in FIGS. 11A and 11B, a case where eight spine coils SPN1 to SPN8 are attached to the top board 8a is illustrated. The eight spine coils SPN1 to SPN8 satisfy the following relation. For example, a distance from the center of a certain spine coil to the center of a spine coil adjacent thereto is 100 millimeters. The width of the spine coil is 100 millimeters.

As illustrated in the example in FIG. 11A, such a case is described that when a couch position in the last examination is 1000 millimeters, the MRI apparatus 100 selects three spine coils SPN3, SPN4, and SPN5. In this case, if the couch position is moved by 200 millimeters in the current examination from the couch position in the previous examination to become 1200 millimeters, the MRI apparatus 100 moves the position of the spine coil to be selected by 200 millimeters to select three spine coils SPN5, SPN6, and SPN7.

Sixth Modification of First Embodiment

In the first embodiment and the first to fifth modifications described above, a case where the presentation control function 15c causes to display the protocol candidates and the candidates or the imaging conditions in the field 43 has been described. However, the presentation control function 15c may not cause to display the protocol candidates and the candidates for the imaging conditions in the field 43. FIG. 12 is an explanatory diagram of an example of processing performed by the MRI apparatus 100 according to the sixth modification.

As illustrated in the example in FIG. 12, the presentation control function 15c of the MRI apparatus 100 according to the sixth modification can cause to display the candidates for the protocol groups in the field 42, and not to display the protocol candidates and the candidates for the imaging conditions. Accordingly, the MRI apparatus 100 presents candidates for the protocol groups narrowed down from a plurality of candidates for protocol groups that can be selected to a user. Therefore, the user can easily select the protocol group. As a result, according to the MRI apparatus 100 of the sixth modification, the user can set the protocol and the imaging condition easily.

Seventh Modification of First Embodiment

A seventh modification of the first embodiment is described next. In the first embodiment and the first to sixth modifications described above, a case where the display 10 installed in an operator's room displays the narrowed down protocols, thereby representing the narrowed down protocols to a user in the operator's room has been described. However, in the seventh modification, the display can be also arranged in an examination room adjacent to the operator's room, so that the display arranged in the examination room displays the narrowed down protocols, as in the display 10. Accordingly, the narrowed down protocols can be presented to the user in the examination room.

According to at least one of the embodiments and one of the modifications described above, setting of an imaging condition can be easily performed by a user.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
   processing circuitry configured to acquire information of an RF (radio frequency) coil, and
   set a protocol to be applied to imaging using the RF coil, before performing the imaging; and
   a display configured to display, when there are a plurality of protocols that can be selected as a protocol applied to the imaging, at least one protocol that is narrowed down from the protocols as a protocol applicable to the imaging based on the information of the RF coil, wherein the display displays the at least one protocol narrowed down from the protocols based on coil classification information in which the RF coil is classified according to imaging applications, wherein
   the coil classification information includes priority information set based on a region that can be imaged by using the RF coil, and when a plurality of RF coils are connected to an apparatus body, the display displays the at least one protocol narrowed down based on the priority information included in the coil classification information.

2. The magnetic resonance imaging apparatus according to claim wherein the processing circuitry acquires the information of the RF coil from the RF coil connected to an apparatus body.

3. A magnetic resonance imaging apparatus comprising:
processing circuitry configured to acquire information of an RF (radio frequency) coil, and
set a protocol to be applied to imagine using the RF coil, before performing the imagining; and
a display configured to display, when there are a plurality of protocols that can be selected as a protocol applied to the imaging, at least one protocol that is narrowed down from the protocols as a protocol applicable to the imaging based on the information of the RF coil, wherein
when a plurality of examinations are to be performed and a second examination is performed after a first examination, the processing circuitry acquires information of an RF coil newly added in the second examination at a time of performing the second examination, each of the examinations being a unit of executing a protocol group, and
the display displays the at least one protocol narrowed down based on the information of the RF coil newly added in the second examination.

4. A magnetic resonance imaging apparatus comprising:
processing circuitry configured to acquire information of an RF (radio frequency) coil, and
set a protocol to be applied to imagine using the RR coil, before performing the imaging; and
a display configured to display, when there are a plurality of protocols that can be selected as a protocol applied to the imaging, at least one protocol that is narrowed down from the protocols as a protocol applicable to the imaging based on the information of the RF coil, wherein the display displays a plurality of protocols narrowed down based on the information of the RF coil according to a display order based on a use history of the protocols.

5. A magnetic resonance imaging apparatus comprising:
processing circuitry configured to acquire information of an RF (radio frequency) coil, and
set a protocol to be applied to imaging using the RF coil, before performing the imaging; and
a display configured to display, when there are a plurality of protocols that can be selected as a protocol applied to the imaging, at least one protocol that is narrowed down from the protocols as a protocol applicable to the imaging based on the information of the RF coil, wherein the display displays a protocol to be executed at a time of imaging an imaging region having a highest imaging frequency, among the plurality of protocols.

6. The magnetic resonance imaging apparatus according to claim wherein the display displays a protocol to be executed at a time of imaging an imaging region examined last time, among the plurality of protocols.

* * * * *